(12) United States Patent
He et al.

(10) Patent No.: US 6,284,602 B1
(45) Date of Patent: Sep. 4, 2001

(54) PROCESS TO REDUCE POST CYCLING PROGRAM VT DISPERSION FOR NAND FLASH MEMORY DEVICES

(75) Inventors: Yue-song He, San Jose; Kent K. Chang, Cupertino; Allen U. Huang, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/399,526

(22) Filed: Sep. 20, 1999

(51) Int. Cl.[7] .............................................. H01L 21/8247
(52) U.S. Cl. .......................... 438/258; 438/261; 438/266; 438/981
(58) Field of Search ...................................... 438/258, 261, 438/264, 266, 267, 981

(56) References Cited

U.S. PATENT DOCUMENTS

| | | | |
|---|---|---|---|
| 5,106,772 | 4/1992 | Lai ....................... | 438/264 |
| 5,229,311 | 7/1993 | Lai et al. ............... | 438/264 |
| 5,296,411 | * 3/1994 | Gardner et al. ........ | 438/264 |
| 5,371,030 | 12/1994 | Bergemont ............ | 438/261 |
| 5,397,720 | 3/1995 | Kwong et al. ......... | 438/301 |
| 5,498,577 | * 3/1996 | Fulford et al. ......... | 438/981 |
| 5,541,436 | 7/1996 | Kwong et al. ......... | 257/410 |
| 5,629,893 | 5/1997 | Tang et al. ............ | 365/218 |
| 5,656,527 | 8/1997 | Choi et al. ............ | 438/258 |
| 5,776,811 | 7/1998 | Wang et al. ........... | 438/264 |
| 5,801,076 | 9/1998 | Ghneim et al. ........ | 438/261 |
| 5,861,347 | * 1/1999 | Maiti et al. ........... | 438/264 |
| 5,885,870 | * 3/1999 | Maiti et al. ........... | 438/261 |
| 5,972,751 | 10/1999 | Ramsbey et al. ...... | 438/264 |
| 6,023,085 | 2/2000 | Fang .................... | 438/266 |
| 6,040,216 | 3/2000 | Sung .................... | 438/258 |

OTHER PUBLICATIONS

Wolf, "Silicon Processing for the VLSI Era", vol. 1, Process Technology, pp. 175–182, 1986.*

Yoon, et al., 1993, Mat. Res. Soc. Symp. Proc. vol. 303, pp. 291–296.

Zeng, et al., Nov. 1996, IEEE Transactions on Electrons Devices, vol. 43, No. 11, pp. 1907–1913.

He et al. —09/399,414 filed Sep. 20, 1999.

* cited by examiner

Primary Examiner—Chandra Chaudhari
(74) Attorney, Agent, or Firm—Renner, Otto, Boisselle & Sklar, LLP (57) ABSTRACT

In one embodiment, the present invention relates to a method of forming a NAND type flash memory device involving the steps of growing a first oxide layer over at least a portion of a substrate, the substrate including a flash memory cell area and a select gate area; removing a portion of the first oxide layer in the flash memory cell area of the substrate; growing a second oxide layer over at least a portion of the substrate in the flash memory cell area and over at least a portion of the a first oxide layer in the select gate area; annealing the first oxide layer and the second oxide layer under an inert gas and at least one of $N_2O$ and NO for a period of time from about 1 minute to about 15 minutes; depositing a first in situ doped amorphous silicon layer over at least a portion of the second oxide layer, the first in situ doped amorphous silicon layer having a thickness from about 400 Å to about 1,000 Å; depositing a dielectric layer over at least a portion of the first in situ doped amorphous silicon layer; depositing a second doped amorphous silicon layer over at least a portion of the dielectric layer; and forming a flash memory cell in the flash memory cell area of the substrate and a select gate transistor in the select gate area substrate, the flash memory cell comprising the second oxide layer, the first in situ doped amorphous silicon layer, the dielectric layer, and the second doped amorphous silicon layer, and the select gate transistor comprising the first oxide layer, the second oxide layer, the first in situ doped amorphous silicon layer, the dielectric layer, and the second doped amorphous silicon layer.

15 Claims, 5 Drawing Sheets

PROCESS TO REDUCE POST CYCLING PROGRAM VT DISPERSION FOR NAND FLASH MEMORY DEVICES

TECHNICAL FIELD

The present invention generally relates to improved methods of making flash memory devices such as EEPROMs. More particularly, the present invention relates to methods of making NAND type flash memory devices characterized by reduced post cycling program Vt dispersion.

BACKGROUND ART

Semiconductor devices typically include multiple individual components formed on or within a substrate. Such devices often comprise a high density section and a low density section. For example, as illustrated in prior art FIG. 1a, a memory device such as a flash memory 10 comprises one or more high density core regions 11 and a low density peripheral portion 12 on a single substrate 13. The high density core regions 11 typically consist of at least one M×N array of individually addressable, substantially identical floating-gate type memory cells and the low density peripheral portion 12 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

Figures 1A, 1B, 1C:
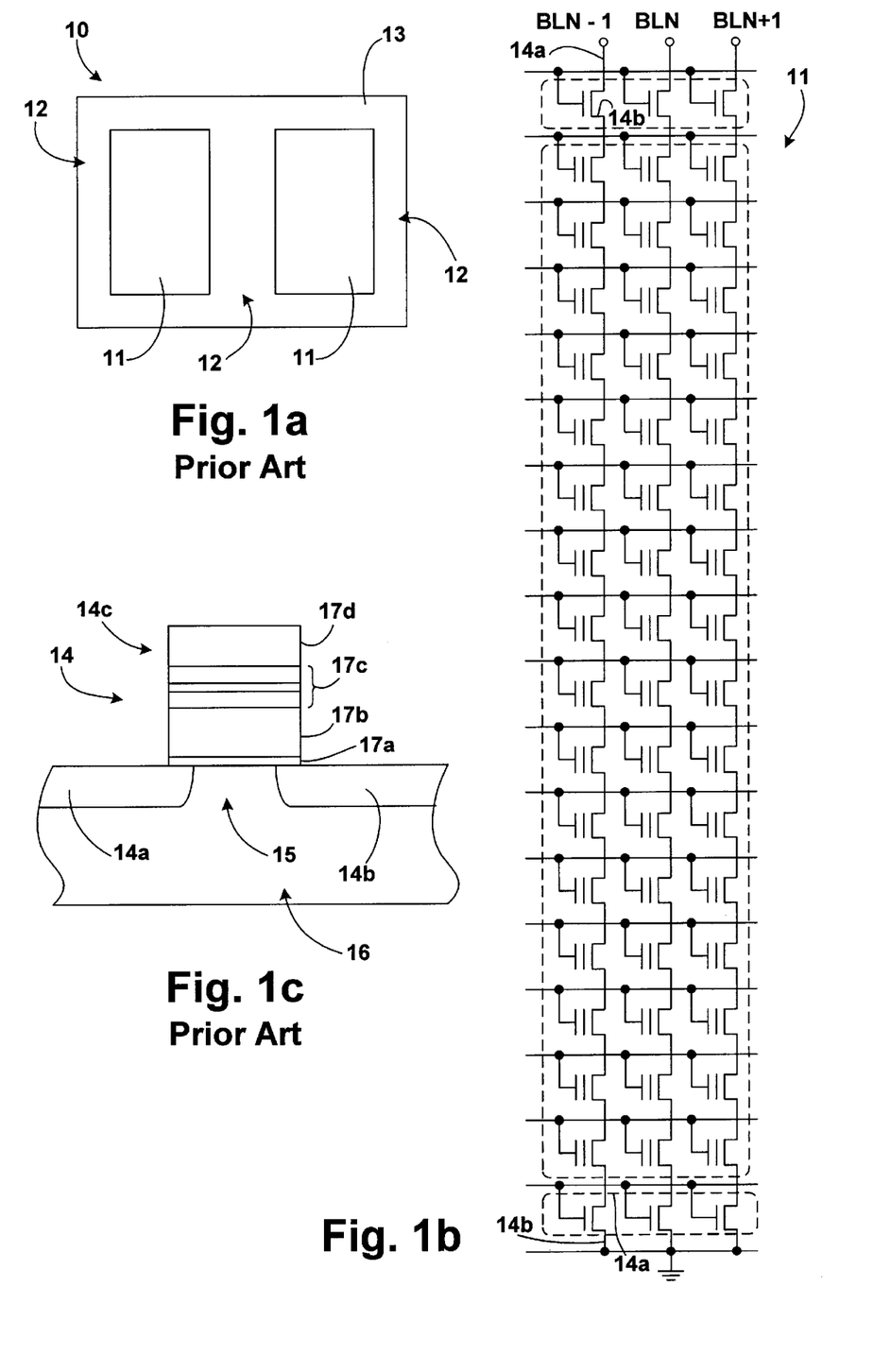
FIG. 1a is a plan view illustrating a prior art layout of a flash memory chip.
FIG. 1b is a schematic diagram illustrating a prior art NAND-type flash memory circuit configuration.
FIG. 1c is a fragmentary cross section illustrating a prior art stacked gate flash memory cell.

The memory cells within the core portion 11 are coupled together in a NAND-type circuit configuration, such as, for example, the configuration illustrated in prior art FIG. 1b. Each memory cell 14 has a drain 14a, a source 14b and a stacked gate 14c. A plurality of memory cells 14 connected together in series with a drain select transistor at one end and a source select transistor at the other end to form a NAND string as illustrated in prior art FIG. 1b. Each stacked gate 14c is coupled to a word line (WL0, WL1, . . . , WLn) while each drain of the drain select transistors are coupled to a bit line (BL0, BL1, . . . , BLn). Lastly, each source of the source select transistors are coupled to a common source line Vss. Using peripheral decoder and control circuitry, each memory cell 14 can be addressed for programming, reading or erasing functions.

Prior art FIG. 1c represents a fragmentary cross section diagram of a typical memory cell 14 in the core region 11 of prior art FIGS. 1a and 1b. Such a cell 14 typically includes the source 14b, the drain 14a and a channel 15 in a substrate or P-well 16; and the stacked gate structure 14c overlying the channel 15. The stacked gate 14c further includes a thin gate dielectric layer 17a (commonly referred to as the tunnel oxide) formed on the surface of the P-well 16. The stacked gate 14c also includes a polysilicon floating gate 17b which overlies the tunnel oxide 17a and an interpoly dielectric layer 17c overlies the floating gate 17b. The interpoly dielectric layer 17c is often a multilayer insulator such as an oxide-nitride-oxide (ONO) layer having two oxide layers sandwiching a nitride layer. Lastly, a polysilicon control gate 17d overlies the interpoly dielectric layer 17c. The control gates 17d of the respective cells 14 that are formed in a lateral row share a common word line (WL) associated with the row of cells (see, for example, prior art FIG. 1b). In addition, as highlighted above, the drain regions 14a of the respective cells in a vertical column are connected together by a conductive bit line (BL). The channel 15 of the cell 14 conducts current between the source 14b and the drain 14a in accordance with an electric field developed in the channel 15 by the stacked gate structure 14c.

The process for making such NAND type flash memory devices includes numerous individual processing steps, as there are numerous elements of the flash memory devices. There are numerous concerns associated with making flash memory devices that provide consistent performance and reliability. There are also numerous concerns associated with making high quality elements that constitute flash memory devices. For example, tunnel oxides must be able to endure electrical stress in order to properly function. However, the continued trend of scaling (towards miniaturization) often undermines the ability of a tunnel oxide to handle increased amounts of electrical stress. And multiple program/erase cycles tend to increase program Vt distribution. This is often caused by undesirably high levels of electron trapping in the tunnel oxide.

In view of the aforementioned concerns and problems, there is a need for flash memory cells of improved quality and more efficient methods of making such memory cells.

SUMMARY OF THE INVENTION

As a result of the present invention, non-volatile flash memory device fabrication is improved thereby producing devices having improved reliability. By employing the methods of the present invention which provide for specific parameters for making tunnel oxides and select gate transistor oxides, the formation of a flash memory devices characterized by reduced post cycling program Vt dispersion is facilitated. More specifically, the methods of the present invention minimize and/or eliminate electron trapping in the tunnel oxide of NAND type flash memory devices. The methods of the present invention further enable the formation of high quality low and high voltage gate oxides despite the employment of nitrogen-oxide annealing.

In one embodiment, the present invention relates to a method of forming a NAND type flash memory device involving the steps of growing a first oxide layer over at least a portion of a substrate, the substrate including a flash memory cell area and a select gate area; removing a portion of the first oxide layer in the flash memory cell area of the substrate; growing a second oxide layer over at least a portion of the substrate in the flash memory cell area and over at least a portion of the a first oxide layer in the select gate area; annealing the first oxide layer and the second oxide layer under an inert gas and at least one of $N_2O$ and NO for a period of time from about 1 minute to about 15 minutes; depositing a first in situ doped amorphous silicon layer over at least a portion of the second oxide layer, the first in situ doped amorphous silicon layer having a thickness from about 400 Å to about 1,000 Å; depositing a dielectric layer over at least a portion of the first in situ doped amorphous silicon layer; depositing a second doped amorphous silicon layer over at least a portion of the dielectric layer, and forming a flash memory cell in the flash memory cell area of the substrate and a select gate transistor in the select gate area substrate, the flash memory cell comprising the second oxide layer, the first in situ doped amorphous silicon layer, the dielectric layer, and the second doped amorphous silicon layer, and the select gate transistor comprising the first oxide layer, the second oxide layer, the first in situ doped amorphous silicon layer, the dielectric layer, and the second doped amorphous silicon layer.

In another embodiment, the present invention relates to a method of forming a NAND type flash memory device involving the steps of forming a first oxide layer over at least a portion of a substrate, the substrate including a core region with a flash memory cell area and a select gate area, and a periphery region with a high voltage transistor area and a low voltage transistor area; forming a nitride layer over at least a portion of the first oxide layer; removing the nitride layer and the first oxide layer from the core region of the substrate exposing the substrate in the core region; forming a second oxide layer over at least a portion of the core region of the substrate; removing a portion of the second oxide layer in the flash memory cell area of the core region of the substrate; forming a third oxide layer over at least a portion of the substrate in the flash memory cell area and over at least a portion of the second oxide layer in the select gate area; annealing the second oxide layer and the third oxide layer in the select gate area of the core region of the substrate and the third oxide layer in the flash memory cell area of the core region of the substrate in an atmosphere comprising an inert gas and at least one of $N_2O$ and NO; depositing a first in situ doped amorphous silicon layer over at least a portion of the substrate; depositing a dielectric layer over at least a portion of the substrate; removing the dielectric layer, the first in situ doped amorphous silicon layer, the nitride layer, and the first oxide layer in the periphery region of the substrate; forming a high voltage transistor gate oxide in the high voltage transistor area of the periphery region of the substrate and low voltage transistor gate oxide in the low voltage transistor area of the periphery region of the substrate; depositing a second doped amorphous silicon layer over at least a portion of the substrate; and forming a flash memory cell in the flash memory cell area of the core region of the substrate, a select gate transistor in the select gate area of the core region of the substrate, a high voltage transistor in the high voltage transistor area of the periphery region of the substrate, and a low voltage transistor in the low voltage transistor area of the periphery region of the substrate.

In yet another embodiment, the present invention relates to a method of making a flash memory cell for a NAND type flash memory device involving the steps of forming a tunnel oxide layer having a thickness from about 50 Å to about 110 Å over at least a portion of a substrate; annealing the tunnel oxide layer in an atmosphere comprising a major amount of an inert gas and a minor amount of at least one of $N_2O$ and NO at a temperature from about 800° C. to about 1,200° C. for a period of time from about 1 minute to about 15 minutes; depositing a first in situ doped amorphous silicon layer over the tunnel oxide layer; forming a dielectric layer over the first in situ doped amorphous silicon layer; and depositing a second in situ doped amorphous silicon layer over the dielectric layer.

BRIEF DESCRIPTION OF DRAWINGS

FIG. 2a is a schematic diagram illustrating a core portion of a NAND-type flash memory device; and FIG. 2b is a plan layout view of the core portion of the NAND-type flash memory device of FIG. 2a.

DISCLOSURE OF THE INVENTION

As a result of the present invention, non-volatile flash memory devices having improved reliability are obtainable. By employing the methods of the present invention, tunnel oxides are formed with improved quality, reliability and performance. Also by employing the methods of the present invention, low and high voltage gate oxides are formed with improved quality, reliability and performance. Moreover, the production of flash memory cells characterized by reduced post cycling program Vt dispersion is facilitated.

The present invention is described with reference to the drawings wherein like reference numerals are used to refer to like elements throughout. The present invention relates to a flash memory device and a method for its manufacture that, according to one aspect of the present invention, improves the quality of the flash memory cell tunnel oxide.

The present invention may be understood and its advantages appreciated in conjunction with the process of FIGS. 2–13. A circuit schematic diagram illustrating a core portion 11 of a NAND-type flash memory device is illustrated in FIG. 2a. The core portion 11 includes a memory cell region 22 which is bounded on one side by a drain select transistor portion 24 and bounded on another side by a source select transistor portion 26. Each of the select transistor portions 24 and 26 contain select gate transistors 24a–24c and 26a–26c, respectively, which operate to selectively activate a desired bit line (for example, BLN-1, BLN, BLN+1) by ensuring the selectivity of each bit line and preventing the cell current from conducting current through the bit line during a programming operation as is known by those skilled in the art.

Figures 2A, 2B:
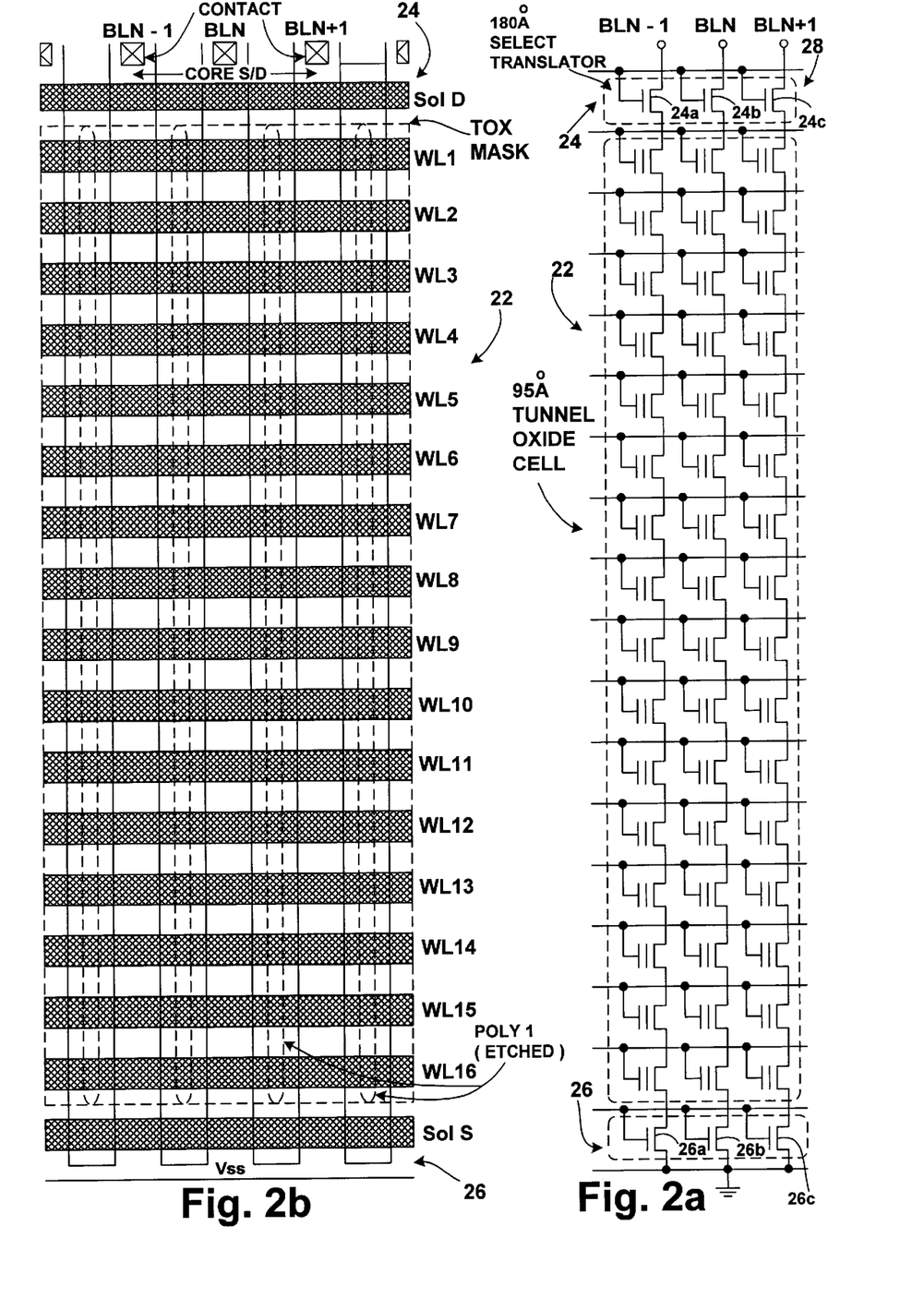

In the NAND-type flash memory process which forms the core circuit 28 of FIG. 2a and its corresponding circuit layout (of which FIG. 2b is a plan view), an improved process is used to form the stacked memory cells and the select gate transistor.

The core select gate transistors 24a–24c and 26a–26c are somewhat similar in structure to the stacked gate flash memory structures in the memory cell region 22 except that their gate oxide is approximately twice as thick as the cell oxide (also called the tunnel oxide) in the stacked gate structure of the memory cell (about 170 Å compared to about 95 Å). The select transistors 24a–24c utilize a gate oxide of about 170 Å to improve the reliability of the transistors by reducing the vulnerability of the devices to band to band tunneling induced hot carrier stress during programming. A plan circuit layout view of the conventional NAND-type circuit arrangement is illustrated in FIG. 2b.

Prior to providing a specific example of the methods of the present invention, a general example is provided. A first or sacrificial oxide layer is grown over at least a portion of the semiconductor substrate. The sacrificial oxide layer is grown using any suitable means, such as dry oxidation, wet oxidation or thermal oxidation. The sacrificial oxide layer is typically grown over at least the periphery region and the core region of the substrate. The periphery region contains two areas; namely, the high voltage gate transistor area and the low voltage gate transistor area while the core region contains two areas; namely, the stacked memory cell area and the select gate transistor area. In one embodiment, the sacrificial oxide layer has a thickness from about 100 Å to about 400 Å. In another embodiment, the sacrificial oxide layer has a thickness from about 200 Å to about 300 Å.

A nitride layer is deposited over at least a portion of the sacrificial oxide layer. The nitride layer preferably comprises silicon nitride. The nitride layer is formed using any suitable means, such as chemical vapor deposition (CVD) including plasma enhanced chemical vapor deposition (PECVD) and low pressure chemical vapor deposition (LPCVD). The nitride layer serves as a hard mask for subsequent processing. In one embodiment, the nitride layer has a thickness from about 100 Å to about 400 Å. In another embodiment, the nitride layer has a thickness from about 200 Å to about 300 Å.

A mask is then provided over the periphery region, leaving exposed the nitride layer in the core region. The nitride layer in the core region is etched using a suitable etching procedure, leaving exposed the sacrificial oxide layer in the core region. The sacrificial oxide layer in the core region is etched using a suitable etching procedure, leaving exposed the substrate in the core region. Each of the (one or both of the etching steps may optionally include at least one corresponding cleaning step). In a preferred embodiment, a buffered oxide etch process is employed to remove the sacrificial oxide layer. The mask is then removed from the periphery region.

A second oxide layer is grown using any suitable means, such as dry oxidation, wet oxidation or thermal oxidation, on at least a portion of the substrate in the exposed core region. The second oxide layer later serves as a portion of the select gate transistor oxide. In one embodiment, the second oxide layer has a thickness from about 130 Å to about 170 Å. In another embodiment, the second oxide has a thickness from about 110 Å to about 190 Å.

A mask is then provided over the select gate transistor area of the core region, leaving exposed the second oxide layer in the stacked memory cell area. The second oxide layer in the stacked memory cell area is etched using a suitable etching procedure, which may optionally include at least one corresponding cleaning step. In a preferred embodiment, a buffered oxide etch process is employed to remove the second oxide layer in the stacked memory cell area The mask is then removed.

The structure is then subject to another oxidation process to provide a third oxide layer. In particular, a third oxide layer is provided in the stacked memory cell area of the core region while the thickness of the second layer in the select gate transistor area is increased. Oxidation is performed using any suitable means, such as dry oxidation, wet oxidation or thermal oxidation. The increased oxide layer in select gate transistor area of the core region is used to later form the select gate transistor oxide. The second oxide layer in the stacked memory cell area is used to later form the tunnel oxide. In one embodiment, the increased oxide layer in select gate transistor area has a thickness from about 140 Å to about 200 Å while the second oxide in the stacked memory cell area has a thickness from about 50 Å to about 110 Å. In another embodiment, the increased oxide layer in select gate transistor area has a thickness from about 150 Å to about 190 Å while the second oxide in the stacked memory cell area has a thickness from about 60 Å to about 100 Å.

The structure is then optionally annealed in an inert atmosphere. The inert atmosphere contains at least one inert gas such as a noble gas or nitrogen. Nobles gases include He, Ne, Ar, Kr, Xe and Rn. Argon and/or nitrogen are preferred. Annealing in the inert atmosphere is conducted for a relatively short period of time, for example, about 5 minutes or less. In one embodiment, optional inert annealing is conducted at a temperature from about 900° C. to about 1,200° C. for about 4 minutes or less. In another embodiment, optional inert annealing is conducted at a temperature from about 1,000° C. to about 1,100° C. for about 3 minutes or less.

The structure is then annealed in a nitrogen-oxide atmosphere. The nitrogen-oxide atmosphere contains at least one of $N_2O$ and NO and at least one inert gas (such as those listed above). In a preferred embodiment, the nitrogen-oxide atmosphere contains $N_2O$ and at least one of argon and nitrogen. The nitrogen-oxide annealing provides the most benefits to the subsequently formed tunnel oxide of the flash memory cells when the nitrogen-oxide atmosphere contains a major amount (at least about 50% by weight) of at least one inert gas and a minor amount (less than about 50% by weight) of at least one of $N_2O$ and NO. In one embodiment, the nitrogen-oxide atmosphere contains from about 1% to about 40% by weight of at least one of $N_2O$ and NO and from about 60% to about 99% by weight of at least one inert gas. In another embodiment, the nitrogen-oxide atmosphere contains from about 5% to about 35% by weight of at least one of $N_2O$ and NO and from about 65% to about 95% by weight of at least one inert gas. In yet another embodiment, the nitrogen-oxide atmosphere contains from about 10% to about 30% by weight of at least one of $N_2O$ and NO and from about 70% to about 90% by weight of at least one inert gas.

In one embodiment, nitrogen-oxide annealing is conducted at a temperature from about 800° C. to about 1,200° C. for a period of time from about 1 minute to about 15 minutes. In another embodiment, nitrogen-oxide annealing is conducted at a temperature from about 900° C. to about 1,100° C. for a period of time from about 2 minutes to about 10 minutes. In yet another embodiment, nitrogen-oxide annealing is conducted at a temperature from about 950° C. to about 1,050° C. for a period of time from about 3 minutes to about 8 minutes. In one embodiment, nitrogen-oxide annealing is conducted using from about 100 standard cubic centimeters per minute (sccm) to about 10,000 sccm of at least one of $N_2O$ and NO and from about 1 standard liter per minute (slm) to about 25 slm of at least one inert gas. In another embodiment, nitrogen-oxide annealing is conducted using from about 200 standard sccm to about 5,000 sccm of at least one of $N_2O$ and NO and from about 2 slm to about 20 slm of at least one inert gas. In yet another embodiment, nitrogen-oxide annealing is conducted using from about 250 standard sccm to about 4,000 sccm of at least one of $N_2O$ and NO and from about 5 slm to about 17.5 slm of at least one inert gas.

After nitrogen-oxide annealing, the thickness of the increased oxide layer increases, typically from about 0.5% to about 15% in size. In another embodiment, the thickness of the increased oxide layer increases from about 1% to about 10% in size. In one embodiment, the nitrogen-oxide annealed oxide layer in select gate transistor area has a thickness from about 140 Å to about 200 Å while the nitrogen-oxide annealed second oxide in the stacked memory cell area has a thickness from about 50 Å to about 110 Å. In another embodiment, the nitrogen-oxide annealed oxide layer in select gate transistor area has a thickness from about 150 Å to about 190 Å while the nitrogen-oxide annealed second oxide in the stacked memory cell area has a thickness from about 60 Å to about 100 Å.

Due to the presence of the sacrificial oxide layer and the nitride layer in the periphery region, nitrogen-oxide annealing does not deleteriously affect or degrade the periphery region. Therefore, subsequent processing in the periphery region is not problematic. Low voltage gate oxides and high voltage gate oxides of high quality may be formed in the periphery region after nitrogen-oxide annealing in accordance with the present invention.

Next, a first doped amorphous silicon layer is provided over at least a portion of the nitrogen-oxide annealed second oxide (over the select gate transistor area and stacked memory cell area), and typically over the entire structure. The first doped amorphous silicon layer later serves as the floating gate of the stacked memory cell (also termed Poly 1) and the gate of the select gate transistor. The first doped amorphous silicon layer is made using any suitable conditions, including a deposition/doping process or an in situ doping process. The dopant employed to make the thin first doped amorphous silicon layer is at least one of phosphorus and arsenic. The dopant is present in any suitable concentration.

In one embodiment, the resultant first doped amorphous silicon layer has a thickness from about 400 Å to about 1,200 Å, and preferably from about 500 Å to about 1,100 Å. In another embodiment, the resultant first doped amorphous silicon layer has a thickness from about 600 Å to about 1,000 Å.

A dielectric layer is provided using any suitable means over at least a portion of the first doped amorphous silicon layer. The dielectric layer preferably contains three layers; namely two oxide layers sandwiching a nitride layer (a so-called ONO layer). The dielectric layer later serves as the interpoly dielectric layer of the stacked memory cell. In one embodiment, the dielectric layer has a thickness from about 100 Å to about 160 Å, and preferably from about 120 Å to about 140 Å.

A mask such as a suitable photoresist is used to cover the core region and the exposed portion of the substrate is etched down to the silicon substrate (the dielectric layer, the first doped amorphous silicon layer, the nitride layer and first oxide layer are removed in the periphery region of the substrate). Multiple etching steps may be employed to remove the dielectric layer, the first doped amorphous silicon layer, the nitride layer and the first oxide layer.

A fourth oxide layer is provided using any suitable means, such as dry oxidation, wet oxidation or thermal oxidation, on at least a portion of the exposed portions of the silicon substrate (over at least a portion of the periphery region). The fourth oxide layer later serves as the gate oxide for subsequently formed high voltage transistors in the periphery region. In one embodiment, the second gate oxide has a thickness from about 260 Å to about 300 Å. In another embodiment, the second gate oxide has a thickness from about 270 Å to about 290 Å. The fourth oxide layer has a thickness that is greater than the third oxide layer (the fourth oxide layer also has a thickness that is greater than the fifth oxide layer discussed below).

A mask such as a suitable photoresist is used to cover the high voltage transistor areas of the periphery region and the exposed portions of the fourth oxide layer are etched down to the silicon substrate (the fourth oxide layer in the low voltage transistor area of the periphery region is removed) using suitable etch techniques such as wet etch techniques. The mask may, if necessary, cover the stacked memory cell areas of the core region to prevent degradation of the dielectric layer.

A fifth oxide layer is provided using any suitable means, such as dry oxidation, wet oxidation or thermal oxidation, over at least a portion of the exposed portions of the silicon substrate (over the low voltage transistor area of the periphery region). The fifth oxide layer later serves as the gate oxide for subsequently formed low voltage transistors in the periphery region. In one embodiment, the fifth oxide layer has a thickness from about 150 Å to about 190 Å. In another embodiment, the fifth oxide layer has a thickness from about 160 Å to about 180 Å. The fifth oxide layer has a thickness that is greater than the third oxide layer.

A second doped amorphous silicon layer is provided using any suitable means over at least a portion of the substrate (typically over the core and periphery regions) including a deposition/doping process or an in situ doping process. The dopant employed to make the thin first doped amorphous silicon layer is at least one of phosphorus and arsenic. The dopant is present in any suitable concentration. The second doped amorphous silicon layer later serves as the control gate of the stacked memory cell (also termed Poly 2), the select gate, the high voltage gate and the low voltage gate. In one embodiment, the second doped amorphous silicon layer has a thickness from about 1,000 Å to about 1,400 Å, and preferably from about 1,100 Å to about 1,300 Å.

Additional layers are provided using any suitable means over portions of the second doped amorphous silicon layer. For example, a tungsten silicide layer and a silicon oxynitride layer may be provided over the second doped amorphous silicon layer. The tungsten silicide layer may be formed by suitable means, such as via CVD techniques using a gas flow including either $SiH_2Cl_2$ and $WF_6$ or $SiH_4$ and $WF_6$. In a preferred embodiment, the tungsten silicide layer is provided using $SiH_2Cl_2$ and $WF_6$ with an inert gas. After the tungsten silicide deposition, an optional rapid thermal anneal (RTA) is performed in a nitrogen atmosphere. In one embodiment, the tungsten silicide layer has a thickness from about 1,000 Å to about 1,800 Å. In another embodiment, the tungsten silicide layer has a thickness from about 1,200 Å to about 1,600 Å.

A series of masks and etch steps (such as self aligned etch steps) are employed to form various structures including flash memory cells, select gate transistors, low voltage gate transistors, high voltage gate transistors, word lines, interconnections, and the like. These steps are known in the art. Consequently, the NAND-type process involves the fabrication of at least two types of devices including four types of devices; namely, a stacked gate memory cell in the core region, a select gate transistor in the core region, a low voltage gate transistor in the periphery region and a high voltage gate transistor in the periphery region. As a result of the present invention, and in particular the processing steps and conditions associated with forming the tunnel oxide of the flash memory cells and the gate oxide of the select gate transistors, a high quality flash memory device is produced.

Due to the manner in which the flash memory cells are fabricated (in accordance with the present invention), less electron trapping inside the tunnel oxide occurs compared to flash memory cells that are not fabricated in accordance with the present invention. Since electron trapping associated with the inventive flash memory cells is minimized, uniform programming speeds are realized (relatively narrow program Vt distribution).

Figure 3:
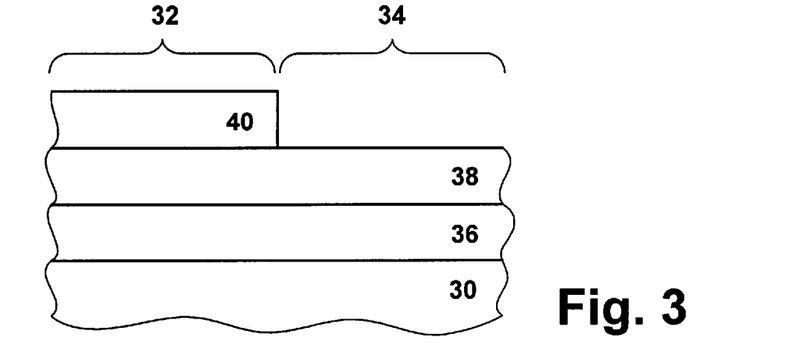
FIG. 3 is a cross sectional illustration of one aspect of a method of making a NAND type flash memory device in accordance with the present invention.

A specific embodiment of a semiconductor manufacturing process flow illustrating the NAND-type flash memory device process in accordance with the present invention is described in greater detail in conjunction with FIGS. 3–13. Referring to FIG. 3, a substrate 30 is provided. The substrate 30 is typically a silicon substrate optionally with various elements, regions and/or layers thereover; including metal layers, barrier layers, dielectric layers, device structures, active regions such as active silicon regions or areas, active elements and passive elements including P wells, N wells, additional polysilicon gates, wordlines, source regions, drain regions, bit lines, bases, emitters, collectors, conductive lines, conductive plugs, etc. The substrate 30 has two main regions; namely, a periphery region 32 and a core region 34. The core region 34 includes select gate transistor area 46 and a stacked memory cell area 48 (see FIG. 5) while the periphery region 32 includes a high voltage gate transistor area 58 and a low voltage gate transistor area 60 (see FIG. 12).

A first oxide layer 36 is provided over at least a portion of the substrate 30 or over the entire substrate 30. The first oxide layer 36, which constitutes a sacrificial oxide layer has a thickness of about 250 Å. The first oxide layer 36 in this embodiment is formed or grown by a dry oxidation process at about 900° C. under 13 l of oxygen, 450 cc HCl, and 15 l of argon. The dry oxidation process may be followed by an annealing step at about 900° C. under argon. A silicon nitride layer 38 is deposited over the first oxide layer 36. The silicon nitride layer 38 is formed via PECVD techniques at a temperature from about 300° C. to about 400° C. The thickness of the silicon nitride layer 38 is in this embodiment is about 250 Å. A mask 40 is used to cover the of the periphery region 32 of the substrate 30 leaving the silicon nitride layer 38 in the core region 34 exposed. The mask 40 contains a suitable photoresist material and is formed using suitable photolithographic techniques including spin on deposition, selective irradiation, and development.

Figure 4:
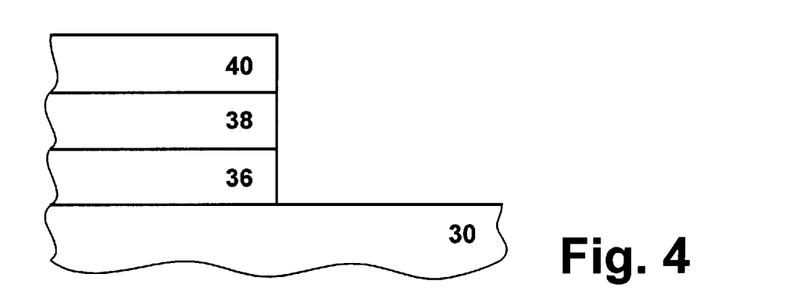
FIG. 4 is a cross sectional illustration of one aspect of a method of making a NAND type flash memory device in accordance with the present invention.

Referring to FIG. 4, the exposed portion of the structure (the core region 34) is etched down to the substrate 30. Specifically, the exposed portions of the silicon nitride layer 38 and the first oxide layer 36 are removed exposing the substrate 30 in the core region 34 using suitable etching techniques. The mask 40 is optionally removed. The silicon nitride layer 38 and the first oxide layer 36 serve as a hard mask in the periphery region 32 protecting that region during subsequent processing.

Figure 5:
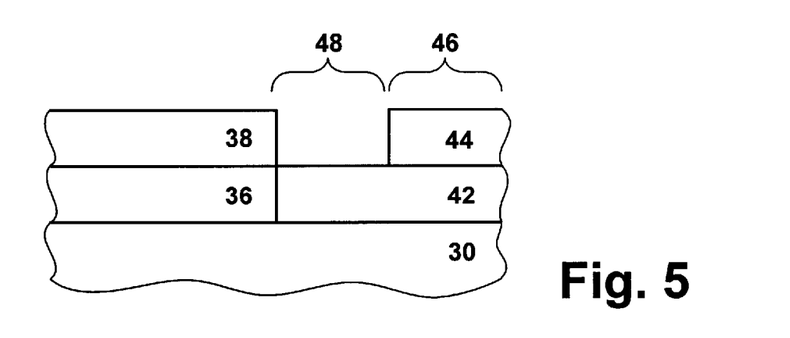
FIG. 5 is a cross sectional illustration of one aspect of a method of making a NAND type flash memory device in accordance with the present invention.

Referring to FIG. 5, a second oxide layer 42 is provided over at least a portion of the core region 34 of the substrate 30 or over the entire substrate 30. The second oxide layer 42, which subsequently forms a portion of the select gate transistor oxide (see FIG. 13) has a thickness of about 148 Å. The second oxide layer 42 in this embodiment is formed or grown by a dry oxidation process at about 900° C. under 13.5 l of oxygen, 462 cc HCl, and 14 l of argon. The dry oxidation process may be followed by an annealing step at about 900° C. under argon. A mask 44 is used to cover the select gate transistor areas 46 of the substrate 30 leaving the second oxide layer 42 in the stacked memory cell area 48 exposed. The mask 44 contains a suitable photoresist material and is formed using suitable photolithographic techniques including spin on deposition, selective irradiation, and development.

Figure 6:
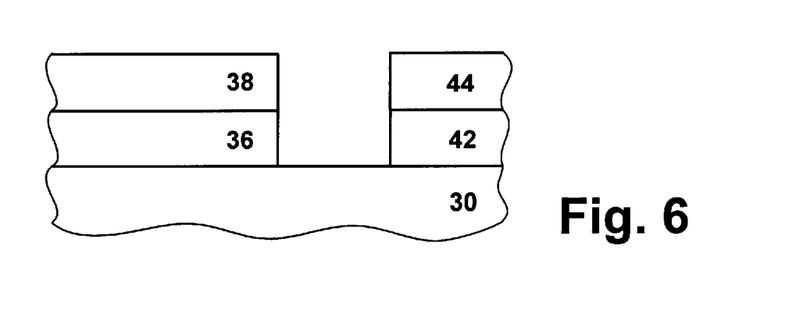
FIG. 6 is a cross sectional illustration of one aspect of a method of making a NAND type flash memory device in accordance with the present invention.

Referring to FIG. 6, the exposed portion of the structure (the stacked memory cell area 48) is etched down to the substrate 30. Specifically, the exposed portions of the second oxide layer 42 are removed exposing the substrate 30 in the stacked memory cell area 48 using suitable etching techniques.

Figure 7:
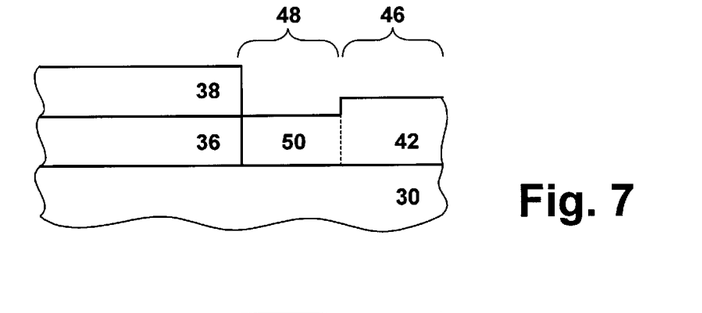
FIG. 7 is a cross sectional illustration of one aspect of a method of making a NAND type flash memory device in accordance with the present invention.

Referring to FIG. 7, the mask 44 is removed and a third oxide layer 50 is provided on at least a portion of the exposed portions of the substrate 30 and the second oxide layer 42 is thickened (over the stacked memory cell area 48 and the select gate transistor area 46). In this embodiment, the third oxide layer 50 is formed by dry oxidation at about 1050° C. under 1.33 l oxygen, 12.6 l of argon, and 70 cc of HCl. The third oxide layer 50 is then annealed under argon at about 1050° C. for about 80 seconds. The third oxide layer 50 subsequently forms the tunnel oxide for the stacked memory cell and combines with the second oxide layer 42 to subsequently form the gate oxide for the select gate transistor (see FIG. 13). The third oxide layer 50 has a thickness of about 87 Å in the stacked memory cell area 48 and about 165 Å in the select gate transistor area 46. In the select gate transistor area 46, the second oxide layer 42 shown is a combination of the second oxide layer increased by the third oxide layer, and thus is simply represented as a thicker portion of the second oxide layer 42 as compared to the thinner portion of the third oxide layer 50 in the stacked memory cell area 48.

The exposed oxides in the stacked memory cell area 48 and the select gate transistor area 46 are annealed in a nitrogen-oxide atmosphere. In this embodiment, annealing is performed at about 1,000° C. for about 5.5 minutes under 2,500 sccm $N_2O$ and 14 l argon. The nitrided third oxide layer 50 has a thickness of about 95 Å in the stacked memory cell area 48 while the nitrided second oxide layer 42 has a thickness of about 175 Å in the select gate transistor area 46.

Figure 8:
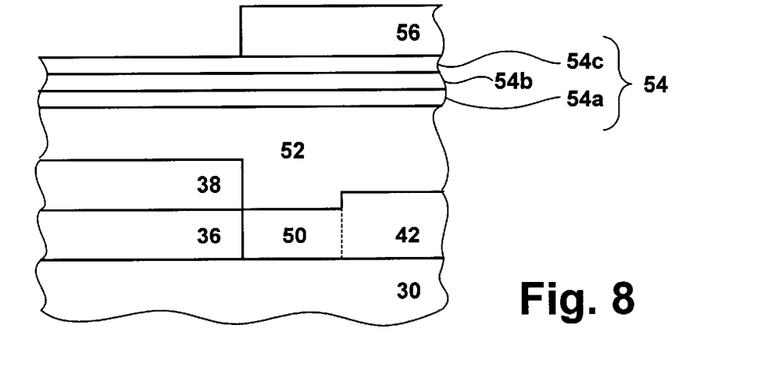
FIG. 8 is a cross sectional illustration of one aspect of a method of making a NAND type flash memory device in accordance with the present invention.

Referring to FIG. 8, a first doped amorphous silicon layer 52 is provided using an in situ doping process over at least a portion of the third/second oxide layer 50 and 42. In this embodiment, a phosphorus doped amorphous silicon layer is deposited via CVD to form a doped amorphous silicon layer 38 at 530° C., 400 mTorr, $SiH_4$ at 2000 sccm, and a mixture of 1% by weight $PH_3$ in helium at about 22 sccm. The first doped amorphous silicon layer 52 (also termed Poly 1) subsequently forms the floating gate (see FIG. 13) of the stacked memory cell and the gate of the select gate transistor. The first doped amorphous silicon layer 52 has a thickness of about 900 Å.

A dielectric layer 54 is provided over at least a portion of the first doped amorphous silicon layer 52. The dielectric layer 54 is an ONO multilayer dielectric containing three layers; namely an oxide layer 54a, a nitride layer 54b, and another oxide layer 54c. The dielectric layer subsequently forms the interpoly dielectric layer (see FIG. 13) of the stacked memory cell. The dielectric layer has a thickness of about 130 Å. Oxide layer 54a is deposited at a temperature of about 750° C. under $SiH_4$ at 20 cc, $N_2O$ at 1.2 l and a pressure of 600 mTorr via low pressure CVD (LPCVD) on the first doped amorphous silicon layer 52. Nitride is next deposited at a temperature of about 760° C. under NH$_3$ at 600 cc, SiH$_2$Cl$_2$ at 100 cc and a pressure of 330 mTorr to form a nitride layer 54b. The nitride layer 54b is oxidized with wet oxygen at a temperature of about 950° C. under O$_2$ at 5 l and H$_2$ at 9 l for 40 minutes to form another oxide layer 54c. A mask 56 is used to cover the core region 34 of the substrate 30 leaving the dielectric layer 54 in the periphery region 32 exposed. The mask 56 contains a suitable photoresist material and is formed using suitable photolithographic techniques including spin on deposition, selective irradiation, and development.

Figure 9:
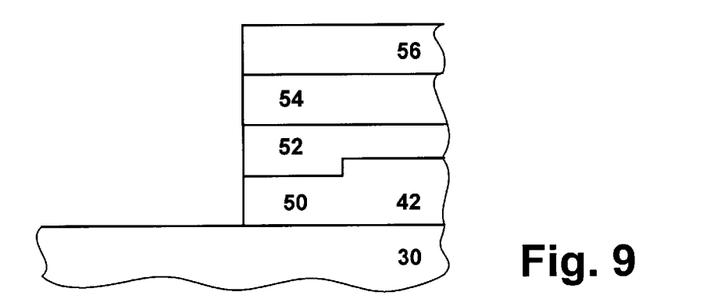
FIG. 9 is a cross sectional illustration of one aspect of a method of making a NAND type flash memory device in accordance with the present invention.

Referring to FIG. 9, the exposed portion of the structure (the periphery region 32) is etched down to the substrate 30. Specifically, the exposed portions of the dielectric layer 54, the first doped amorphous silicon layer 52, the nitride layer 38, and the first oxide layer 36 are removed exposing the substrate 30 in the periphery region 32 using suitable etching techniques.

Figure 10:
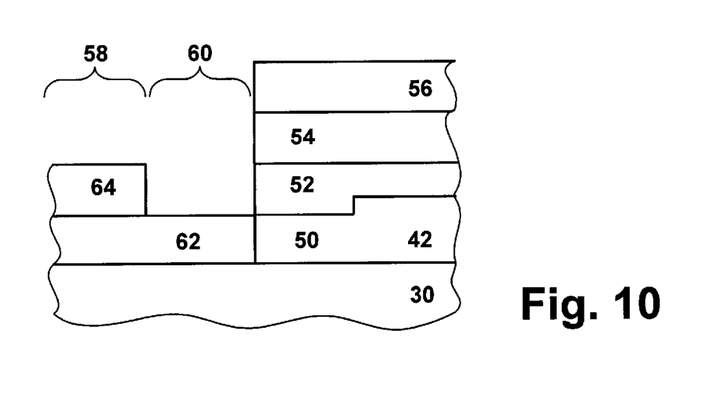
FIG. 10 is a cross sectional illustration of one aspect of a method of making a NAND type flash memory device in accordance with the present invention.

Referring to FIG. 10, fourth gate oxide layer 62 is provided on at least a portion of the exposed portions of the substrate 30 (over the periphery region 32). In this embodiment, the fourth gate oxide layer 62 is formed by wet oxidation at about 800° C. under 6.4 l oxygen, 2.133 l of hydrogen, and 75 cc of HCl, and optionally annealing at about 900° C. under nitrogen. The fourth gate oxide 62 subsequently forms the gate oxide for the high voltage transistors in the periphery region 32 (see FIG. 13). In this embodiment, the fourth gate oxide layer 62 has a thickness of about 285 Å. A mask 64 is positioned to cover the high voltage transistor areas 58 of the periphery region 32. The mask 64 contains a suitable photoresist material and is formed using suitable photolithographic techniques including spin on deposition, selective irradiation, and development. Although not shown, the mask 64 may also cover the core region 34 to prevent degradation of the dielectric layer 54.

Figure 11:
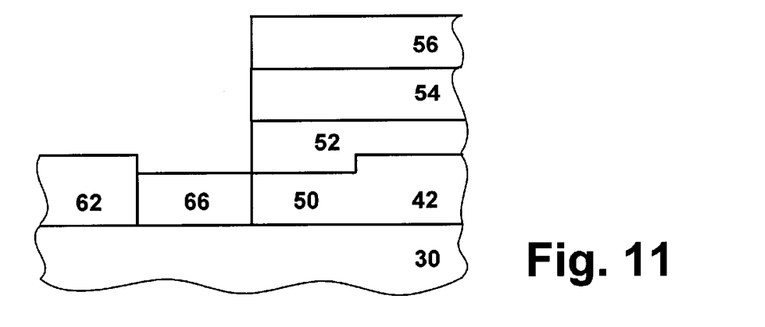
FIG. 11 is a cross sectional illustration of a one aspect of a method of making NAND type flash memory device in accordance with the present invention.

Referring to FIG. 11, the exposed portions of the fourth gate oxide layer 62 are etched down to the silicon substrate 30 (the fourth gate oxide in the low voltage transistor area 60 of the periphery region 32 is removed). Any suitable oxide selective etchant may be employed.

A fifth gate oxide layer 66 is provided on at least a portion of the exposed portions of the substrate 30 (over the low voltage transistor area 60 the periphery region 32). In this embodiment, the fifth gate oxide layer 66 is formed by wet oxidation at about 800° C. under 6.4 l oxygen, 2.133 l of hydrogen, and 75 cc of HCl, and optionally annealing at about 900° C. under nitrogen. The fifth gate oxide layer 66 subsequently forms the gate oxide for the low voltage transistors in the periphery region 32 (see FIG. 13). In this embodiment, the fifth gate oxide layer 66 has a thickness of about 168 Å. Any remaining masks are removed.

Figure 12:
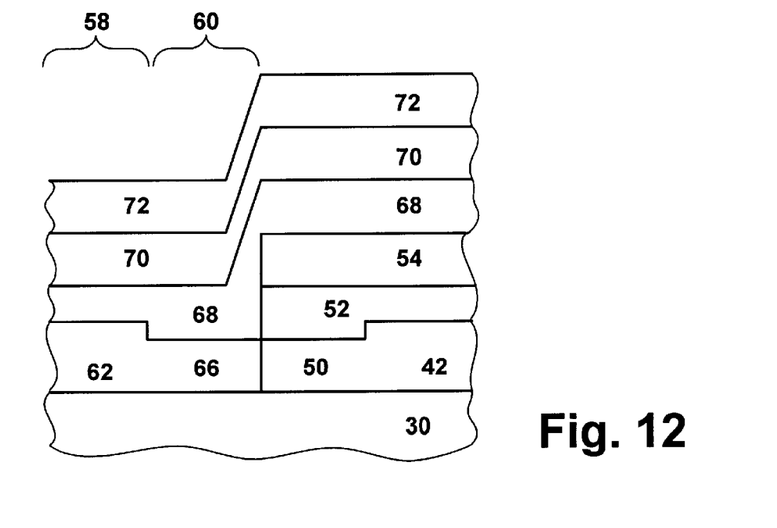
FIG. 12 is a cross sectional illustration of one aspect of a method of making a NAND type flash memory device in accordance with the present invention.

Referring to FIG. 12, a second doped amorphous silicon layer 68 is provided over at least a portion of the substrate. In this embodiment, the phosphorus doped amorphous silicon layer is deposited via LPCVD to form a doped amorphous silicon layer 68 at 530° C., 400 mTorr, SiH$_4$ at 2000 sccm, and a mixture of 1% by weight PH$_3$ in helium at about 22 sccm. The second doped amorphous silicon layer 68 has a thickness of about 1,200 Å. The second doped amorphous silicon layer 68 subsequently forms the control gate of the stacked memory cell (also termed Poly 2), the high voltage transistor gate and the low voltage transistor gate.

A tungsten silicide layer 70 is provided over at least a portion of the second doped amorphous silicon layer 68. The tungsten silicide layer 70 may be formed by suitable means. In this embodiment, the tungsten silicide is deposited via CVD techniques at a temperature of about 565° C. and a pressure of about 93 Pa. The gas flow includes WF$_6$ and at least one of SiH$_2$Cl$_2$ and SiH$_4$. The gas flow may further contain an inert gas, such as Ar. After the tungsten silicide deposition, an RTA is performed in a nitrogen atmosphere. The tungsten silicide layer 70 has a thickness of about 1,400 Å.

A silicon oxynitride layer 72 is provided over at least a portion of the tungsten silicide layer 70. The silicon oxynitride layer 72 is formed via suitable techniques including via physical vapor deposition (PVD) techniques. Methods of forming silicon oxynitride are known in the art. The silicon oxynitride layer 72 has a thickness from about 800 Å to about 1,200 Å, but in this embodiment, the thickness is about 1,000 Å.

Figure 13:
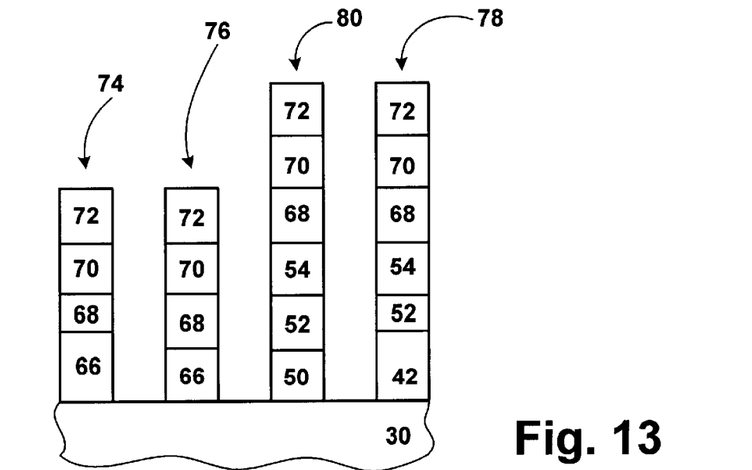
FIG. 13 is a cross sectional illustration of a NAND type flash memory device in accordance with the present invention.

Referring to FIG. 13, a series of masks and etch steps are employed to form various structures including a high voltage transistor 74, a low voltage transistor 76, a select gate transistor 78 and a stacked flash memory cell 80. Although not shown, various contacts and interconnects may be formed, as well as the deposition of an encapsulating oxide film, such as tetraethylorthosilicate (TEOS), borophosphotetraethylorthosilicate (BPTEOS), phosphosilicate glass (PSG), or borophosphosilicate glass (BPSG). The illustration of FIG. 13 is shown along a bit line.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a NAND type flash memory device, comprising:

growing a first oxide layer over at least a portion of a substrate, the substrate including a flash memory cell area and a select gate area;

removing a portion of the first oxide layer in the flash memory cell area of the substrate;

growing a second oxide layer over at least a portion of the substrate in the flash memory cell area and over at least a portion of the a first oxide layer in the select gate area;

annealing the first oxide layer and the second oxide layer under an inert gas and at least one of N$_2$O and NO for a period of time from about 1 minute to about 15 minutes;

depositing a first in situ doped amorphous silicon layer over at least a portion of the second oxide layer, the first in situ doped amorphous silicon layer having a thickness from about 400 Å to about 1,000 Å;

depositing a dielectric layer over at least a portion of the first in situ doped amorphous silicon layer;

depositing a second doped amorphous silicon layer over at least a portion of the dielectric layer; and forming a flash memory cell in the flash memory cell area of the substrate and a select gate transistor in the select gate area substrate, the flash memory cell comprising the second oxide layer, the first in situ doped amorphous silicon layer, the dielectric layer, and the second doped amorphous silicon layer, and the select gate transistor comprising the first oxide layer, the second oxide layer, the first in situ doped amorphous silicon layer, the dielectric layer, and the second doped amorphous silicon layer.

2. The method of claim 1, wherein the first oxide layer has a thickness from about 130 Å to about 170 Å.

3. The method of claim 1, wherein the second oxide layer in the flash memory cell area has a thickness from about 50 Å to about 110 Å.

4. The method of claim 1, wherein the first and second oxide layers in the select gate area have a combined thickness from about 140 Å to about 200 Å.

5. The method of claim 1, wherein the annealing is conducted at a temperature from about 800° C. to about 1,200° C.

6. The method of claim 1, wherein the annealing is conducted under an atmosphere comprising from about 60% to about 99% of the inert gas and from about 1% to about 40% of at least one of $N_2O$ and NO.

7. The method of claim 1, wherein the annealing is conducted at a temperature from about 900° C. to about 1,100° C. for a period of time from about 2 minutes to about 10 minutes.

8. The method of claim 1, wherein the first and second oxide layers in the select gate area and the second oxide layer in the flash memory cell area have a thickness after annealing that is from about 0.5% to about 15% in size greater than the thickness prior to annealing.

9. A method of forming a NAND type flash memory device, comprising:

forming a first oxide layer over at least a portion of a substrate, the substrate including a core region with a flash memory cell area and a select gate area, and a periphery region with a high voltage transistor area and a low voltage transistor area;

forming a nitride layer over at least a portion of the first oxide layer;

removing the nitride layer and the first oxide layer from the core region of the substrate exposing the substrate in the core region;

forming a second oxide layer over at least a portion of the core region of the substrate;

removing a portion of the second oxide layer in the flash memory cell area of the core region of the substrate;

forming a third oxide layer over at least a portion of the substrate in the flash memory cell area and over at least a portion of the second oxide layer in the select gate area;

annealing the second oxide layer and the third oxide layer in the select gate area of the core region of the substrate and the third oxide layer in the flash memory cell area of the core region of the substrate in an atmosphere comprising an inert gas and at least one of $N_2O$ and NO;

depositing a first in situ doped amorphous silicon layer over at least a portion of the substrate;

depositing a dielectric layer over at least a portion of the substrate;

removing the dielectric layer, the first in situ doped amorphous silicon layer, the nitride layer, and the first oxide layer in the periphery region of the substrate;

forming a high voltage transistor gate oxide in the high voltage transistor area of the periphery region of the substrate and low voltage transistor gate oxide in the low voltage transistor area of the periphery region of the substrate;

depositing a second doped amorphous silicon layer over at least a portion of the substrate; and forming a flash memory cell in the flash memory cell area of the core region of the substrate, a select gate transistor in the select gate area of the core region of the substrate, a high voltage transistor in the high voltage transistor area of the periphery region of the substrate, and a low voltage transistor in the low voltage transistor area of the periphery region of the substrate.

10. The method of claim 9, wherein the nitride layer has a thickness from about 100 Å to about 400 Å and first oxide layer has a thickness from about 100 Å to about 400 Å.

11. The method of claim 9, wherein the nitride layer has a thickness from about 200 Å to about 300 Å and first oxide layer has a thickness from about 200 Å to about 300 Å.

12. The method of claim 9, wherein the annealing is conducted at a temperature from about 800° C. to about 1,200° C. for a period of time from about 1 minute to about 15 minutes.

13. The method of claim 9, wherein the annealing is conducted at a temperature from about 900° C. to about 1,100° C. for a period of time from about 2 minutes to about 10 minutes.

14. The method of claim 9, wherein the dielectric layer has a thickness from about 110 Å to about 150 Å and comprises a first oxide layer, a nitride layer over the first oxide layer, and a second oxide layer over the nitride layer.

15. The method of claim 9, wherein after annealing the second oxide layer and the third oxide layer in the select gate area have a thickness from about 140 Å to about 200 Å and the third oxide layer in the flash memory cell area has a thickness from about 50 Å to about 110 Å.

* * * * *